United States Patent [19]
Gardner et al.

[11] Patent Number: 6,060,369
[45] Date of Patent: *May 9, 2000

[54] NITROGEN BEARING SACRIFICIAL OXIDE WITH SUBSEQUENT HIGH NITROGEN DOPANT PROFILE FOR HIGH PERFORMANCE MOSFET

[75] Inventors: Mark I. Gardner, Cedar Creek; Derick J. Wristers; H. Jim Fulford, both of Austin, all of Tex.

[73] Assignee: Advanced Micro Devices, Inc., Sunnyvale, Calif.

[*] Notice: This patent is subject to a terminal disclaimer.

[21] Appl. No.: 08/997,318

[22] Filed: Dec. 23, 1997

[51] Int. Cl.[7] .................................................. H01L 21/76
[52] U.S. Cl. ........................... 438/407; 438/526; 438/775
[58] Field of Search .................................... 438/302, 407, 438/199, 216, 775; 257/369, 325

[56] References Cited

U.S. PATENT DOCUMENTS

| | | | |
|---|---|---|---|
| 5,258,333 | 11/1993 | Shappir et al. | 438/762 |
| 5,516,707 | 5/1996 | Loh et al. | 438/302 |
| 5,559,368 | 9/1996 | Hu et al. | 257/369 |
| 5,596,218 | 1/1997 | Soleimani et al. | 257/325 |

OTHER PUBLICATIONS

Stanley Wolf and Richard N. Tauber, Silicon Processing for the VLSI Era, vol. 1—*Process Technology*, pp. 210–226, 1986.

Stanley Wolf and Richard N. Tauber, Silicon Processing for the VLSI Era, vol. 3—*Process Integration*, pp. 182–188, 222–235, 318, 332–333 354–361, 419–439, 1990.

Stanley Wolf and Richard N. Tauber, *Silicon Processing for the VLSI Era*, vol. 3—*The Submicron MOSFET*, pp. 367–407, 648–660, 1995.

*Primary Examiner*—Wael Fahmy
*Assistant Examiner*—William David Coleman
*Attorney, Agent, or Firm*—Timothy M. Honeycutt

[57] ABSTRACT

A integrated circuit transistor that has a high nitrogen concentration in the channel region and a method of making same are provided. A sacrificial oxide layer integrated with a nitrogen bearing species is grown on the substrate. A portion of the nitrogen bearing species diffuses into the substrate to form a nitrogen doped region. Nitrogen is implanted through the first oxide layer to increase the peak concentration of nitrogen in the nitrogen doped region. The sacrificial oxide layer is removed and a very thin gate oxide layer is formed. A gate, a source, and a drain are formed. The result is an integrated circuit transistor with a very thin gate oxide layer and a high peak concentration of nitrogen substantially at the $Si$—$SiO_2$ interface.

21 Claims, 2 Drawing Sheets

NITROGEN BEARING SACRIFICIAL OXIDE WITH SUBSEQUENT HIGH NITROGEN DOPANT PROFILE FOR HIGH PERFORMANCE MOSFET

BACKGROUND OF THE INVENTION

1. Field of the Invention

This invention relates generally to semiconductor fabrication and, more particularly, to an integrated circuit transistor having a very thin gate oxide layer and a high channel region nitrogen concentration, and to a method of making the same.

2. Description of the Related Art

The metal oxide semiconductor field effect transistor ("MOSFET") is one of the most commonly used electronic components in modern integrated circuits. Microprocessors, analog-to-digital converters, and many other types of devices now routinely include millions of MOSFETs. The dramatic proliferation of MOSFETs in integrated circuit design can be traced, in large part, to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region. The gate electrode is designed to emit an electric field into the channel region. Changes in the electric field emitted by the gate electrode enable, or alternatively, disable the flow of current between the source and the drain.

The electrical performance of a MOSFET is dependent upon maintaining proper levels of several types of dopants in various regions in the substrate, including the channel region. To maintain the requisite composition of the channel region and to tailor the electric field generated by the gate electrode, a gate oxide layer, typically $SiO_2$, is interposed between the gate and the silicon substrate. The gate oxide layer functions to prevent silicon underlying the gate from diffusing into the gate and forming voids in the substrate which can lead to the formation of conductor spikes in the channel region. In addition, the gate oxide layer retards diffusion of contaminants into the channel region which can degrade the electrical characteristics of the MOSFET.

Recent advances in semiconductor processing have plunged the minimum feature size for semiconductor circuits below 0.3 $\mu$m. To maintain desirable electrical performance for MOSFETs with such shortened channel lengths, gate oxide thicknesses for MOSFETs have generally scaled downward in conjunction with the shrinking of minimum feature sizes. As the minimum feature size falls to 0.1 $\mu$m and below, it is anticipated that gate oxide thicknesses scaled below 50 Å will be advantageous.

Conventional fabrication processes for forming thin gate oxide layers present certain difficulties. To begin with, the growth rate of $SiO_2$ in existing processes is difficult to control. As a consequence, gate oxide layers are often unintentionally grown with larger thicknesses than desired or with undesirably nonuniform thicknesses. In addition, thin $SiO_2$ layers are prone to hot carrier degradation, particularly in PMOSFETs, and may have high defect densities that render them unsuitable as effective masks against the diffusion of impurities into the substrate.

Various methods have been proposed for producing $SiO_2$ gate oxide layers that are not only thin, but also more resistant to hot carrier degradation and more suitable as impurity barriers. One method involves thermal nitridation of $SiO_2$ in an $NH_3$ ambient at high temperature. This method may result in the formation of undesirable electron traps in the gate oxide. In another method, a nitrided oxide layer is reoxidized. Although this method reduces the potential for electron traps, there remains the potential for undesirably thick oxides, higher than desired fixed charge densities, and the requirement for multiple high temperature steps that do not favor ULSI fabrication. Another method involves oxynitridation of a substrate in an $N_2O$ ambient. This method can result in large nonuniformities in the composition of the oxide layer. One other method utilizes oxide growth in an $O_2$ ambient followed by nitridation in an $N_2O$ ambient. This method is complex and time consuming. A drawback common to all of the foregoing methods is the inability to form a thin gate oxide layer with a peak nitrogen concentration greater than about 0.5 to 3% at the Si—$SiO_2$ interface.

The present invention is directed to overcoming or reducing one or more of the foregoing disadvantages.

SUMMARY OF THE INVENTION

In accordance with one aspect of the present invention, a method of fabricating an integrated circuit transistor in a substrate is provided. The method includes the steps of forming a first oxide layer containing a nitrogen bearing species on the substrate where a portion of the nitrogen bearing species diffuses into the substrate to form a nitrogen doped region. Nitrogen is implanted through the first oxide layer to increase the peak concentration of nitrogen in the nitrogen doped region. The first oxide layer is removed. A second oxide layer is formed on the substrate and over the nitrogen doped region. A gate electrode is formed on the substrate and over the second oxide layer. A source and a drain are formed in the substrate.

In accordance with another aspect of the present invention, a method of forming a gate oxide for an integrated circuit transistor in a substrate is provided. The method includes the steps forming a first oxide layer containing a nitrogen bearing species on the substrate where a portion of the nitrogen bearing species diffuses into the substrate to form a nitrogen doped region. Nitrogen is implanted through the first oxide layer to increase the peak concentration of nitrogen in the nitrogen doped region. The first oxide layer is removed. A second oxide layer is formed on the substrate and over the nitrogen doped region.

In accordance with still another aspect of the present invention, an integrated circuit transistor is provided. The integrated circuit transistor includes a semiconductor substrate doped with nitrogen, a source, and a drain. The source and the drain are spaced laterally to define a channel region in the semiconductor substrate. A gate oxide layer is coupled to the semiconductor substrate. The gate oxide layer and the substrate define an oxide-semiconductor substrate interface. A gate electrode is coupled to the semiconductor substrate and disposed over the channel region. The peak concentration of nitrogen is greater than 5 atomic percent and is located substantially at the oxide-semiconductor interface.

In accordance with another aspect of the present invention, an integrated circuit transistor is provided. The integrated circuit transistor includes a semiconductor substrate and a gate oxide layer coupled to the semiconductor substrate. The gate oxide layer and the substrate define an oxide-semiconductor substrate interface. The gate oxide layer is formed by forming a first oxide layer containing a nitrogen bearing species on the substrate wherein a portion of the nitrogen bearing species diffuses into the substrate to form a nitrogen doped region. Nitrogen is implanted through the first oxide layer to increase the peak concentration of nitrogen in the nitrogen doped region. The first oxide layer is removed. A second oxide layer is formed on the substrate and over the nitrogen doped region. The integrated circuit transistor also includes a source and drain that are spaced laterally to define a channel region in the semiconductor substrate. A gate electrode is coupled to the semiconductor substrate and disposed over the channel region.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
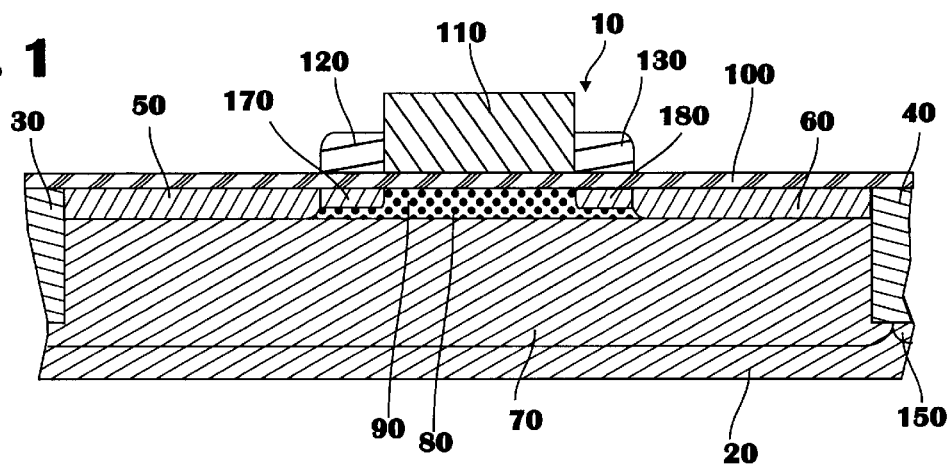
FIG. 1 is a cross-sectional view of an exemplary embodiment of an integrated circuit transistor fabricated in accordance with the present invention.

Turning now to the drawings, and in particular to FIG. 1, there is shown an exemplary embodiment of an integrated circuit transistor ("transistor") 10 fabricated in accordance with the present invention. The transistor 10 may be an IGFET, a MOSFET, or other type of transistor and may be n-channel or p-channel. For the purposes of illustration, the transistor 10 is depicted as a PMOSFET and the process flow for fabricating the transistor 10 is described herein in the context of a twin well CMOS technology. However, the person of ordinary skill in the art will appreciate that the invention may be applied to transistors in NMOS or CMOS technology. The transistor 10 is formed on a substrate 20 and is electrically isolated from other structures in the substrate 20 by isolation trenches 30 and 40. The transistor 10 includes a source 50 and a drain 60 disposed in a N-well 70 and displaced laterally to define a channel region 80. The channel 80 is collocated with a region of heavy nitrogen doping as indicated by the small circles 90. A gate oxide layer 100 is disposed on the substrate 20 over the source 50, the drain 60, and the channel region 80. A gate electrode 110 is disposed on the gate oxide 100 over the channel region 80. Sidewall spacers 120 and 130 are disposed on the gate oxide layer 100 adjacent to the gate electrode 110.

Figure 2:
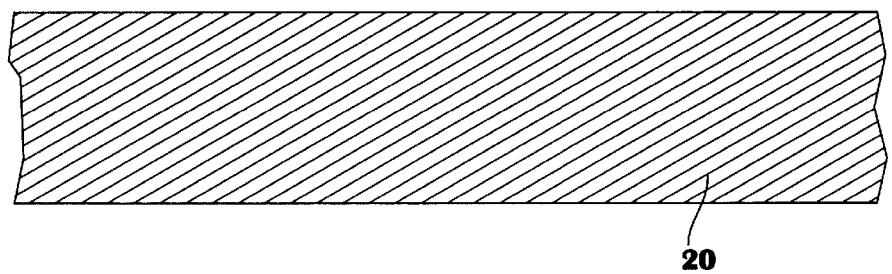
FIG. 2 is a cross-sectional view of a portion of the substrate for the integrated circuit transistor of FIG. 1 in accordance with the present invention.
Figure 3:
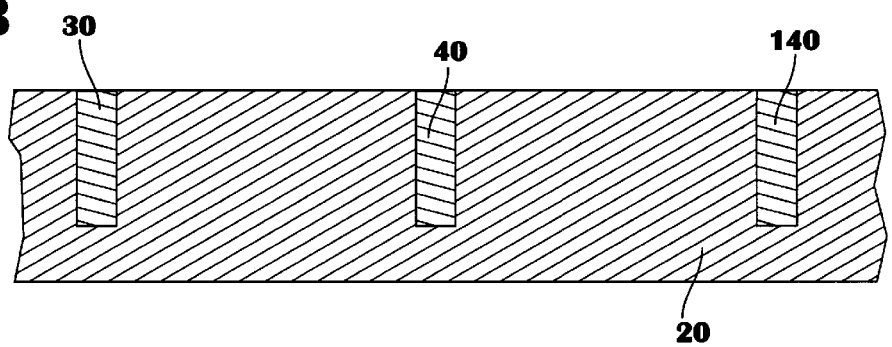
FIG. 3 is a cross-sectional view of the substrate of FIG. 2 following formation of trench isolation structures in accordance with the present invention.

The process flow for fabricating the transistor 10 in accordance with the present invention may be understood by referring to FIGS. 2, 3, 4, 5, 6, 7, and 8, and initially to FIGS. 2 and 3. The process begins with the provision of the substrate 20. The substrate 20 is advantageously composed of a semiconductor material, such as, for example, p or n-doped silicon, silicon-on-insulator, or like semiconductor materials. Referring now to FIG. 3, the substrate 20 is provided with isolation trenches 30, 40, and 140: The isolation trenches 30, 40, and 140 may be fabricated using well known trench isolation techniques, such as shallow trench and reflow, and may be composed of $SiO_2$, polysilicon lined with $SiO_2$, or other commonly used materials for isolation trenches. Alternatively, the isolation trenches 30, 40, and 140 may be replaced by field oxide regions formed using well known LOCOS processes.

Figure 4:
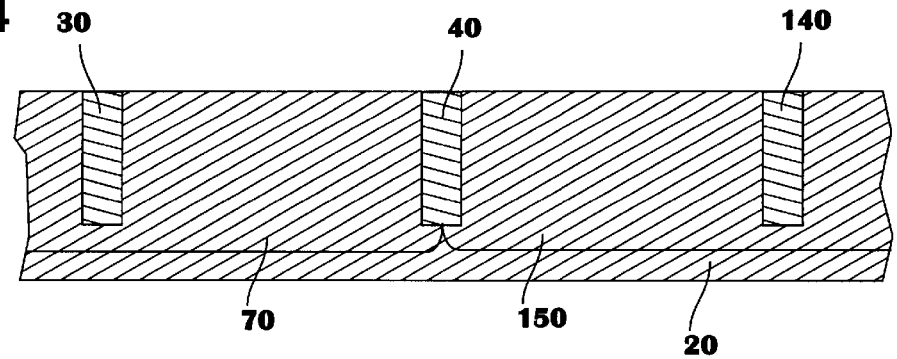
FIG. 4 is a cross-sectional view of the substrate of FIG. 2 following N and P-well formation in accordance with the present invention.

Referring now to FIG. 4, the N-well 70 and a P-well 150 are formed in the substrate 20. The wells 50 and 150 may be twin, twin retrograde, or similar suitable wells, and are formed in the substrate 20 by using well known techniques involving the alternative masking and ion implantation of the regions between the isolation trenches 30 and 40 and the trenches 40 and 140. The person of ordinary skill in the art will appreciate that the parameters for the well implants and the anneal process will depend on the initial doping level of the substrate, and the design rules for the fabrication process used.

Figure 5:
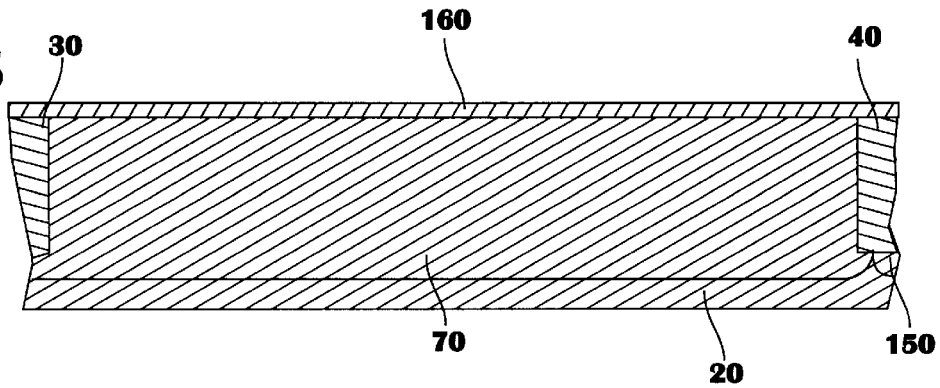
FIG. 5 is a cross-sectional view of one of the twin wells depicted in FIG. 4 with a sacrificial oxide layer disposed thereon in accordance with the present invention.

For simplicity of illustration, the following description is focused on the N-well 70 of the twin wells 70 and 150. Referring now to FIG. 5, a first or sacrificial oxide layer 160 is formed on the substrate 20 and over the well 70. As used herein, the terms "formed on" or "disposed on" should be construed to include the possibility that a given layer may be formed on another given layer with a third or other intervening layers disposed between the two. The first oxide layer 160 is advantageously composed of a combination of $SiO_2$ and one or more nitrogen bearing species, such as, for example, $N_2$, $Si_3N_4$, or other nitrogen bearing species. The first oxide layer 160 is formed with the integration of one or more nitrogen bearing species by exposing the substrate 20 to a high temperature ambient of a nitrogen bearing species and an oxygen bearing species. For example, the substrate 20 may be exposed to an ambient of NO, or $N_2O$, or $NH_3$ at approximately 900 to 1050° C. for approximately 30 to 60 seconds in a RTA process. Note that if a nitrogen bearing species, such as NO, contains oxygen that will disassociate and grow the oxide, the nitrogen bearing species and the oxygen bearing species may be the same species. Conversely, if the nitrogen bearing species, such as $NH_3$, does not contain oxygen, the ambient must contain an oxygen bearing species, such as $O_2$. The percentage of $O_2$ may be five to ten percent by volume.

Alternatively, the substrate may be exposed to any of the aforementioned nitrogen bearing species at approximately 800 to 1000° C. for approximately 15 to 30 minutes in a diffusion tube furnace process. In a diffusion tube heating process, it is desirable to ensure that the substrate 20 is heated to temperature prior to exposure to an oxygen bearing species. Accordingly, the substrate 20 may be heated in an inert ambient of $N_2$, argon, or other suitable inert non-oxygen bearing ambient to about 800° C., and thereafter exposed to an oxygen bearing species.

Regardless of the particular thermal process used, the thickness of the first oxide layer 160 may be 20 to 60 Å and is advantageously 40 Å. By integrating $N_2$ into the growth of the first oxide layer 160, nitrogen doped region is formed in the channel 80 with a significant amount of nitrogen disposed at the Si—$SiO_2$ interface.

Figure 6:
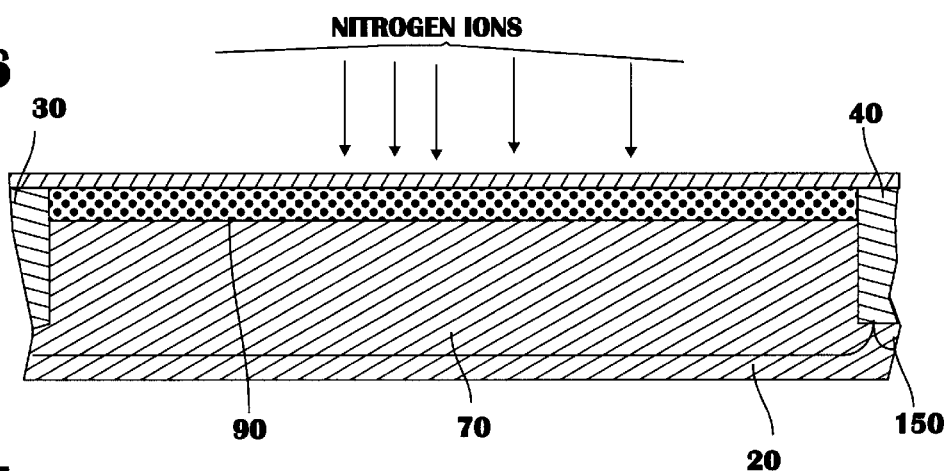
FIG. 6 is a cross-sectional view of the well of FIG. 5 following nitrogen ion implantation in accordance with the present invention.

Referring now to FIG. 6, the substrate 20 is implanted with nitrogen ions to increase the nitrogen doping in the well 70 beneath the first oxide layer 160. As noted above, the nitrogen doping is indicated by the small circles 90. The nitrogen may be in atomic or molecular form. In an exemplary embodiment, the nitrogen is implanted in molecular form. The dosage for the nitrogen ion implantation may be 5E13 to 1E16 ions/cm$^2$, and is advantageously 7E14 ions/cm$^2$. The energy may be 1 to 20 keV and is advantageously 10 keV. The implant angle may be 0°, 7°, or 45°, and is advantageously 7°. The energy and dosage of the implant are tailored to provide a high peak concentration of nitrogen that is located approximately at the Si—SiO$_2$ interface. The combination of the nitrogen diffused during growth of the first oxide layer 160 and the implanted nitrogen results in a peak concentration of nitrogen at the Si—SiO$_2$ interface that is greater than is possible with conventional processes. Furthermore, the high peak nitrogen concentration is achieved without excessive damage to the crystal structure of the upper portions of the substrate 20.

Implants to adjust the threshold voltage $V_T$ of the transistor 10 (see FIG. 1) and to inhibit punchthrough may be performed through the first oxide layer 160 either before or after the nitrogen ion implant. The energy and dosage of the $V_T$ and punchthrough implants will depend upon the dopant type. In an exemplary embodiment, the dopant is BF$_2$. The dosage for the threshold voltage adjust implant may be 2E12 to 7E12 ions/cm$^2$ and is advantageously 4.5E12 ions/cm$^2$. The energy may be 1 to 30 keV and is advantageously 15 keV. The dosage for the punchthrough inhibitor implant may be 2E12 to 7E12 ions/cm$^2$ and is advantageously 4.5E12 ions/cm$^2$. The energy may be 50 to 150 keV and is advantageously 100 keV.

Figure 7:
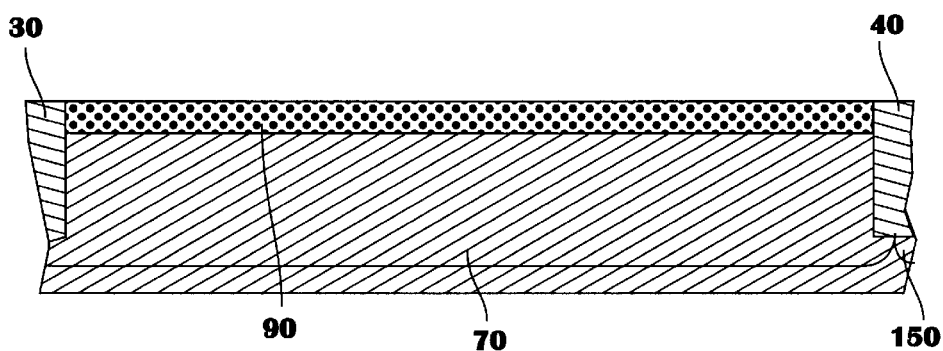
FIG. 7 is a cross-sectional view of the well of FIG. 5 following removal of the sacrificial oxide layer in accordance with the present invention.

Referring now to FIG. 7, the first oxide layer 160 is removed by HF dip at 100 to 1, or 50 to 1 dilution, by buffered oxide etch, or other suitable oxide removal techniques.

Following removal of the first oxide layer 160, the surface of the substrate 20 is cleaned by well known RCA prefurnace cleaning methods.

Figure 8:
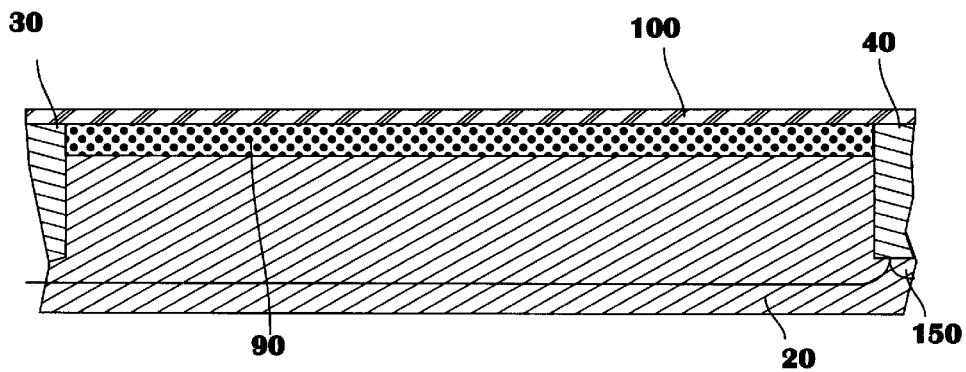
FIG. 8 is a cross-sectional view of the well of FIG. 5 following application of a gate oxide layer in accordance with the present invention.

Referring now to FIG. 8, the second or gate oxide layer 100 is formed on the substrate 20. The gate oxide layer 100 may be grown as relatively pure SiO$_2$ by well known dry oxidation techniques. Alternatively, the gate oxide 100 may be formed with the integration of one or more nitrogen bearing species by exposing the substrate 20 to a high temperature ambient of a nitrogen bearing species and an oxygen bearing species. For example, the substrate 20 may be exposed to an ambient of NO, or N$_2$O, or NH$_3$ at approximately 850 to 1050° C. for approximately 30 to 60 seconds in a RTA process. Note that if a nitrogen bearing species, such as NO, contains oxygen that will disassociate and grow the oxide, the nitrogen bearing species and the oxygen bearing species may be the same species. Conversely, if the nitrogen bearing species, such as NH$_3$, does not contain oxygen, the ambient must contain an oxygen bearing species, such as O$_2$. The percentage of O$_2$ may be five to ten percent by volume.

Alternatively, the substrate 20 may be exposed to any of the aforementioned nitrogen bearing species at approximately 750 to 1000° C. for approximately 15 to 30 minutes in a diffusion tube furnace process. In a diffusion tube heating process, it is desirable to ensure that the substrate 20 is heated to temperature prior to exposure to an oxygen bearing species. Accordingly, the substrate 20 may be heated in an inert ambient of N$_2$, argon, or other suitable inert non-oxygen bearing ambient to about 800° C., and thereafter exposed to an oxygen bearing species.

With or without integration of a nitrogen bearing species during formation of the gate oxide layer 110, the high nitrogen doping in the upper region of the substrate 20 restrains the growth rate of the SiO$_2$. As a result, the gate oxide layer 100 may be formed with a thickness of 10 to 20 Å. The peak concentration of the nitrogen at the Si—SiO$_2$ interface following growth of the gate oxide 100 is about 10 atomic percent. The heavy nitrogen doping in the substrate 20 and particularly in the channel region 80 protects the gate oxide layer 100 from hot carriers. The result is an ultra thin gate oxide layer that is provided with a protective barrier against hot carrier degradation. Note that there will be some trade off between nitrogen ion implant dosage and the resultant potential thickness of the gate oxide layer 100. Higher nitrogen dosages translate into thinner gate oxide layers. Accordingly, the dosage selected for the nitrogen ion implant step should be high enough to achieve the desired nitrogen concentration without sacrificing reliable gate oxide thickness.

Referring again to FIG. 1, the gate electrode 110 is formed on the gate oxide layer 100. The gate electrode 110 may be formed from a variety of conducting materials used to form gate electrodes, such as amorphous silicon, polysilicon, aluminum, copper, or other conducting materials. Well known techniques for forming gate electrodes, such as CVD and anisotropic etching, may be used to fabricate the gate electrode 110. The gate electrode 110 may be 1500 to 2000 Å thick and is advantageously 1750 Å thick.

Following application of the gate electrode 110, the source 50 and the drain 60 may be formed. A self-aligned LDD implant is performed to form the LDD regions 170 and 180. The energy and dosage of the LDD implant will depend upon the dopant type. In an exemplary embodiment, the dopant is BF$_2$. The dosage may be 5E13 to 5E14 ions/cm$^2$ and is advantageously 1E14 ions/cm$^2$. The energy may be 5 to 20 keV and is advantageously 12.5 keV. A dielectric material is then deposited on the gate oxide layer 100 and appropriately masked and etched to form the sidewall spacers 120 and 130 adjacent to the gate electrode 110. The sidewall spacers may be formed from a variety of dielectric materials commonly utilized to form sidewall spacers, such as, for example, SiO$_2$, Si$_3$N$_4$ or other similar dielectric materials. Note that if Si$_3$N$_4$ is used to form the sidewall spacers 120 and 130, the etchant commonly used to etch Si$_3$N$_4$, H$_3$PO$_4$, will be selective to the gate oxide layer 100. A self-aligned source/drain implant may then be performed to form the source 50 and the drain 60. The energy and dosage of the S/D implant will depend upon the dopant type. In an exemplary embodiment, the dopant is BF$_2$. The dosage may be 2E15 to 5E15 ions/cm$^2$ and is advantageously 3.5E15 ions/cm$^2$. The energy may be 30 to 80 keV and is advantageously 55 keV. Following the S/D implant, an anneal is performed to drive the source 50 and the drain 60. The anneal may be carried out at approximately 800 to 1000° C. for about 30 seconds.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an integrated circuit transistor on a substrate, comprising the steps of:
    forming a first oxide layer on the substrate by exposing the substrate to an ambient simultaneously containing an oxygen bearing species and a nitrogen bearing species, wherein nitrogen from the nitrogen bearing species diffuses into the substrate to form a nitrogen doped region;
    implanting nitrogen through the first oxide layer to increase the peak concentration of nitrogen in the nitrogen doped region;
    removing the first oxide layer;
    forming a second oxide layer on the substrate and over the nitrogen doped region;
    forming a gate electrode on the substrate and over the second oxide layer; and
    forming a source and a drain in the substrate.

2. The method of claim 1, wherein the step of forming the source and the drain comprises implanting a dopant species into the substrate to form lightly doped drain structures in the substrate beneath the gate electrode, forming first and second insulating sidewall spacers on the substrate adjacent to the gate electrode, implanting the dopant species into the substrate, and annealing the substrate.

3. The method of claim 1, wherein the step of forming the first oxide layer comprises exposing the substrate to an ambient containing a nitrogen bearing species and an oxygen bearing species at approximately 900 to 1050° C. for approximately 30 to 60 seconds.

4. The method of claim 1, wherein the nitrogen bearing species is NO.

5. The method of claim 1, wherein the nitrogen bearing species is $N_2O$.

6. The method of claim 1, wherein the nitrogen bearing species is $NH_3$.

7. The method of claim 1, wherein the step of forming the first oxide layer comprises exposing the substrate to an ambient containing a nitrogen bearing species and an oxygen bearing species at approximately 800 to 1000° C. for approximately 15 to 30 minutes.

8. The method of claim 7, wherein the substrate is not exposed to the oxygen bearing species until the substrate temperature reaches about 800° C.

9. The method of claim 1, wherein the step of forming the second oxide layer comprises thermally growing $SiO_2$.

10. The method of claim 9, wherein the $SiO_2$ is grown in an ambient containing a nitrogen bearing species.

11. The method of claim 1, comprising the step of implanting a dopant species through the first oxide layer to adjust the threshold voltage of the transistor.

12. The method of claim 11, comprising the step of implanting a second dopant species through the first oxide layer to prevent punchthrough.

13. A method of forming a gate oxide for an integrated circuit transistor on a substrate, comprising the steps of:
    forming a first oxide layer on the substrate by exposing the substrate to an ambient simultaneously containing an oxygen bearing species and a nitrogen bearing species, wherein nitrogen from the nitrogen bearing species diffuses into the substrate to form a nitrogen doped region;
    implanting nitrogen through the first oxide layer to increase the peak concentration of nitrogen in the nitrogen doped region;
    removing the first oxide layer; and
    forming a second oxide layer on the substrate and over the nitrogen doped region.

14. The method of claim 13 wherein the step of forming the first oxide layer comprises exposing the substrate to an ambient containing a nitrogen bearing species and an oxygen bearing species at approximately 900 to 1050° C. for approximately 30 to 60 seconds.

15. The method of claim 13, wherein the nitrogen bearing species is NO.

16. The method of claim 13, wherein the nitrogen bearing species is $N_2O$.

17. The method of claim 13, wherein the nitrogen bearing species is $NH_3$.

18. The method of claim 13, wherein the step of forming the first oxide layer comprises exposing the substrate to an ambient containing a nitrogen bearing species and an oxygen bearing species at approximately 800 to 1000° C. for approximately 15 to 30 minutes.

19. The method of claim 18, wherein the substrate is not exposed to the oxygen bearing species until the substrate temperature reaches about 800° C.

20. The method of claim 13, wherein the step of forming the second oxide layer comprises thermally growing $SiO_2$.

21. The method of claim 20, wherein the $SiO_2$ is grown in an ambient containing a nitrogen bearing species.

* * * * *